(12) United States Patent
Sekiya

(10) Patent No.: US 7,648,889 B2
(45) Date of Patent: Jan. 19, 2010

(54) PRODUCTION METHOD FOR DEVICE

(75) Inventor: Kazuma Sekiya, Tokyo (JP)

(73) Assignee: Disco Corporation, Tokyo (JP)

( * ) Notice: Subject to any disclaimer, the term of this patent is extended or adjusted under 35 U.S.C. 154(b) by 548 days.

(21) Appl. No.: 11/586,234

(22) Filed: Oct. 25, 2006

(65) Prior Publication Data
US 2007/0093040 A1 Apr. 26, 2007

(30) Foreign Application Priority Data
Oct. 25, 2005 (JP) .............................. 2005-310342

(51) Int. Cl.
*H01L 21/46* (2006.01)
*H01L 21/76* (2006.01)
*H01L 21/301* (2006.01)
*H01L 21/20* (2006.01)
*H01L 21/36* (2006.01)

(52) U.S. Cl. ..................... 438/458; 438/462; 438/489

(58) Field of Classification Search ................ 438/458, 438/489, 462; 257/E21.122
See application file for complete search history.

(56) References Cited

U.S. PATENT DOCUMENTS

| 6,870,248 B1 | 3/2005 | Shibata |
| 2005/0146032 A1 | 7/2005 | Shibata |
| 2005/0146055 A1 | 7/2005 | Shibata |
| 2005/0146056 A1 | 7/2005 | Shibata |
| 2006/0148231 A1* | 7/2006 | Ho et al. ................ 438/612 |

FOREIGN PATENT DOCUMENTS

JP 2001-196528 A 7/2001

* cited by examiner

*Primary Examiner*—William M. Brewster
(74) *Attorney, Agent, or Firm*—Brinks Hofer Gilson & Lione (57) ABSTRACT

A production method for devices includes: a bonding process for placing circuit surfaces of other divided plural semiconductor chips onto circuit surfaces of semiconductor chips of a wafer and bonding the other semiconductor chips to the semiconductor chips of the wafer; and a semiconductor chip grinding process for grinding rear surfaces of the other semiconductor chips by a grinding apparatus while the wafer is held such that the rear surface of the wafer faces a chuck table of the grinding apparatus. The production method further includes a resin filling process for filling a resin on the surface of the wafer so that a surface of the resin corresponds with the rear surfaces of the other semiconductor chips; and a wafer grinding process for grinding the rear surface of the wafer by a grinding apparatus while the wafer is held such that the surface of the wafer on which the resin is filled faces a chuck table of the grinding apparatus. The production method further includes a wafer supporting process for supporting one of the surface and the rear surface of the wafer by a supporting member; and a dividing process for dividing the wafer along predetermined division lines while the wafer is supported by the support member, thereby obtaining devices having the semiconductor chips and the other semiconductor chips bonded on the semiconductor chips.

5 Claims, 6 Drawing Sheets

PRODUCTION METHOD FOR DEVICE

This application claims priority under 35 U.S.C. §119 to Japanese Patent Application No. JP2005-310342 filed Oct. 25, 2005, the entire content of which is hereby incorporated by reference.

BACKGROUND OF THE INVENTION

1. Field of the Invention

The present invention relates to a production method for devices which have chip-on-chip structures or the like in which (for example, two) semiconductor chips are stacked and bonded. In particular, the present invention relates to a production method for devices which can be made very thin by reducing the overall thicknesses of the devices.

2. Description of the Related Art

In recent years, as typified by compact digital devices (for example, mobile phones and digital cameras), various electronic devices have been greatly improved in lightness, thinness, and compactness. In order to achieve this, semiconductor chips and semiconductor package components which have important functions as components are required to be compact and thin. In recent years, a semiconductor device having a chip-on-chip structure in which two or more semiconductor chips are stacked and packaged has been widely used as a device that can be integrated and be made thinner. In particular, instead of a conventional structure in which electrodes are wire-bonded, a structure, in which surfaces of chips face each other and electrodes of electronic circuits formed thereon are directly connected to each other, can be simple and made thinner, thereby being advantageous. For example, semiconductor chips of this type are produced as disclosed in Japanese Unexamined Patent Application Publication No. 2001-196528.

However, these thin devices having a chip-on-chip structure are required to be even thinner. In order to meet this requirement, as disclosed in, for example, Japanese Unexamined Patent Application Publication No. 2001-57404, a technique, in which semiconductor chips stacked on a substrate are ground by a grinding device or the like so as to have desired thicknesses, may be effectively used.

However, when the semiconductor chips, which are stacked on the substrate, are made thinner, there is a limit to the reduction of the overall thickness of the chip-on-chip structures of the semiconductor chips. In addition, it is difficult to make the semiconductor chips thinner while at the same time maintaining the sufficient strength of the semiconductor chips so that no damages (for example, cracking or breakage) occurs therein.

SUMMARY OF THE INVENTION

An object of the present invention is to provide a production method for devices, which can maintain the sufficient strength of the devices and thereby can allow the devices to be made thinner, and which can greatly reduce the overall thicknesses of the devices.

According to one aspect of the present invention, a production method for devices includes: a preparing process for preparing a wafer having plural semiconductor chips which have electronic circuits formed on circuit surfaces of the semiconductor chips and which are partitioned by predetermined division lines on a surface of the wafer, and for preparing other divided plural semiconductor chips having electronic circuits formed on circuit surfaces of the other semiconductor chips. The production method further includes: a bonding process for placing the circuit surfaces of the other semiconductor chips onto the circuit surfaces of the semiconductor chips of the wafer and bonding the other semiconductor chips to the semiconductor chips of the wafer; and a semiconductor chip grinding process for grinding rear surfaces of the other semiconductor chips by a grinding apparatus while the wafer having the other semiconductor chips bonded thereon is held such that the rear surface of the wafer faces a chuck table of the grinding apparatus. The production method further includes: a resin filling process for filling a resin on the surface of the wafer having the other semiconductor chips bonded thereon so that a surface of the resin at least corresponds with the rear surfaces of the other semiconductor chips; and a wafer grinding process for grinding the rear surface of the wafer having the resin filled on the surface by a grinding apparatus while the wafer is held such that the surface of the wafer on which the resin is filled faces a chuck table of the grinding apparatus. The production method further includes: a wafer supporting process for supporting one of the surface and the rear surface of the wafer by a supporting member; and a dividing process for dividing the wafer along the predetermined division lines while the wafer, which is processed by the bonding process, the semiconductor chip grinding process, the resin filling process, the wafer grinding process, and the wafer supporting process, is supported by the support member, thereby obtaining devices having the semiconductor chips and the other semiconductor chips bonded on the semiconductor chips. This aspect of the present invention is the claim 1.

In this aspect of the present invention, after the other semiconductor chips are bonded to the circuit surfaces of the semiconductor chips of the wafer, the rear surfaces of the other semiconductor chips are ground. Then, the rear surface of the wafer is ground, and the wafer is finally divided. As a result, devices having a chip-on-chip structure in which the other semiconductors are bonded on the circuit surfaces of the semiconductor chips are produced. Since not only the other semiconductor chips but also the wafer which is finally intended to be divided into the semiconductor chips in the dividing process is thinned, the overall thicknesses of the devices can be greatly reduced.

Since the rear surfaces of the other semiconductor chips, which are bonded on the wafer which is relatively thick, are ground, sufficient strength is maintained in the semiconductor chip grinding process for grinding the rear surfaces of the other semiconductor chips, so that damages (for example, cracking and breakage) are unlikely to be generated in the wafer and the other semiconductor chips. When the rear surface of the wafer is ground by the grinding apparatus, the surface of the wafer on which the resin is filled is held so as to face the chuck table of the grinding apparatus, so that the wafer can be stably held on the chuck table without being warped. Therefore, damages are unlikely to be generated in the wafer and the other semiconductor chips in the wafer grinding process for grinding the rear surface of the wafer too.

The resin is preferably filled to have a surface which at least corresponds with the rear surfaces of the other semiconductor chips. This is because a side of the surface of the wafer closely contacts, that is, the rear surfaces of the other semiconductor chips closely contact a holding surface of the chuck table without a gap formed therebetween in the wafer grinding process for grinding the rear surface of the wafer. In order to more stably hold the wafer such that the surface on which the resin is filled faces the chuck table in the wafer grinding process, a protective tape may be applied to the surface of the wafer on which the resin is filled, and the wafer may be held on the chuck table via the protective tape.

The process order in this aspect of the present invention may not be limited to the above process order, and it can be freely modified as desired. The above process order is representative in which the bonding process, the semiconductor chip grinding process, the resin filling process, the wafer grinding process, the wafer supporting process, and the dividing process are performed. In the above process order, the semiconductor chip grinding process and the resin filling process can be performed in reverse. In this case, the other semiconductor chips may be ground together with the resin. Alternatively, the production method may use a process order in which the bonding process, the resin filling process, the semiconductor chip grinding process, the wafer supporting process, the wafer grinding process, and the dividing process are performed.

According to another aspect of the present invention, a production method for devices includes: a preparing process for preparing a wafer having plural semiconductor chips which have electronic circuits formed on circuit surfaces of the semiconductor chips and which are partitioned by predetermined division lines on a surface of the wafer, and for preparing other divided plural semiconductor chips having electronic circuits formed on circuit surfaces of the other semiconductor chips. The production method for devices further includes: a wafer grinding process for grinding a rear surface of the wafer by a grinding apparatus while the wafer is held such that the surface of the wafer faces a chuck table of the grinding apparatus; and a bonding process for placing the circuit surfaces of the other semiconductor chips onto the circuit surfaces of the semiconductor chips of the wafer of which the rear surface is ground, and bonding the other semiconductor chips to the semiconductor chips of the wafer. The production method for devices further includes: a wafer supporting process for supporting the rear surface of the wafer by a supporting member; and a semiconductor chip grinding process for grinding rear surfaces of the other semiconductor chips by a grinding apparatus while the wafer having the other semiconductor chips bonded thereon is held such that the rear surface of the wafer which is a surface proximate to the supporting member faces a chuck table of the grinding apparatus. The production method for devices further includes: a dividing process for dividing the wafer along the predetermined division lines while the wafer, which is processed by the wafer grinding process, the bonding process, the wafer supporting process, and the semiconductor chip grinding process, is supported by the support member, thereby obtaining devices having the semiconductor chips and the other semiconductor chips bonded on the semiconductor chips. This aspect of the present invention is the claim 3.

In this aspect of the present invention, after the rear surface of the wafer is first thinned by the grinding, the other semiconductor chips are bonded to the circuit surfaces of the semiconductor chips of the wafer. Then, the rear surfaces of the other semiconductor chips are ground, and the wafer is finally divided. As a result, devices having a chip-on-chip structure in which the other semiconductors are bonded on the circuit surfaces of the semiconductor chips are produced. Since not only the other semiconductor chips but also the wafer which is finally intended to be divided into the semiconductor chips in the dividing process is thinned in this production method too, the overall thicknesses of the devices can be greatly reduced.

In this aspect of the present invention, since the surface of the wafer is held so as to face the chuck table in the first performed wafer grinding process, the wafer can be stably held and ground on the chuck table without being warped. Therefore, damages are unlikely to be generated in the wafer and the other semiconductor chips. When the rear surfaces of the other semiconductor chips bonded on the circuit surfaces of the wafer are ground while the wafer is supported by the supporting member, sufficient strength is maintained, so that damages are unlikely to be generated in the wafer and the other semiconductor chips.

The process order in this aspect of the present invention may not be limited to the above process order, and it can be freely modified as desired. The above process order is representative in which the wafer grinding process, the bonding process, the wafer supporting process, the semiconductor chip grinding process, and the dividing process are performed. Alternatively, the wafer supporting process may be performed before the bonding process.

According to a preferred embodiment of the present invention, the above supporting member has a dicing tape applied to the rear surface of the wafer; and a dicing frame provided on the dicing tape. Any members which can support the wafer flat may use as the supporting member. For example, the supporting member may be a plate-shaped member composed of glass or metal which is rigid. In this case, this plate-shaped member may be applied to the rear surface of the wafer or to the surface of the wafer on which the resin is filled via a double-sided tape or an adhesive.

According to a preferred embodiment, in an appropriate stage before the dividing process, an adhesive film for stacking and applying the divided devices to other semiconductor device or a substrate is applied to the rear surface of the wafer. For example, the supporting member is applied to the rear surface of the wafer in the wafer supporting process, and an adhesive film for bonding is applied to the rear surface of the wafer before the wafer supporting process. When the supporting member is applied to the surface of the wafer in the wafer supporting process, an adhesive film for bonding is applied to the rear surface of the wafer at least before the dividing process.

According to the present invention, since the wafer which has the other semiconductor chips bonded thereon and is finally intended to be divided is also ground, the overall thicknesses of the devices can be greatly reduced. Since the grinding can be performed on the wafer and the other semiconductor chips bonded on the circuit surfaces of the semiconductor chips of the wafer by maintaining the sufficient strength of the devices, the thinning thereof can be performed such that no damages are generated in the wafer and the other semiconductor chips.

DETAILED DESCRIPTION OF THE PRESENTLY PREFERRED EMBODIMENTS

The first embodiment and the second embodiment of the present invention will be explained hereinafter with reference to the drawings.

1. First Embodiment

Figures 1A, 1B:
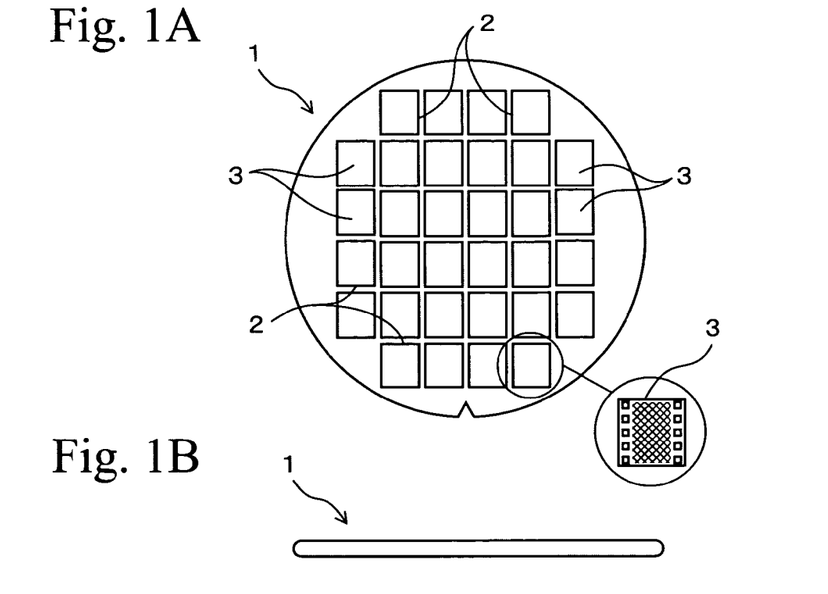
FIGS. 1A and 1B are an overall plain view and a side view which show a semiconductor wafer which is finally intended to be divided into devices in the embodiments according to the present invention, and an enlarged portion in FIG. 1A shows a semiconductor chip.

FIGS. 1A and 1B show a disc-shaped semiconductor wafer 1 (hereinafter referred to simply as a "wafer 1") which is used in a production method of the first embodiment. Plural rectangular semiconductor chips 3 (devices) are partitioned on the surface of the wafer 1 by grid-like streets 2 (predetermined division lines). An electronic circuit (not shown in FIGS. 1A and 1B) is formed on each surface of the semiconductor chips 3. The wafer 1 is obtained by slicing a single crystal rod composed of a semiconductor material (for example, silicon). The wafer 1 favorably has a thickness of 600 to 800 μm in the condition that the wafer 1 is generally commercialized. When the thickness of the wafer 1 is reduced by grinding or the like, the thickness of the wafer 1 is preferably at least about 400 μm or more.

Figure 2A:
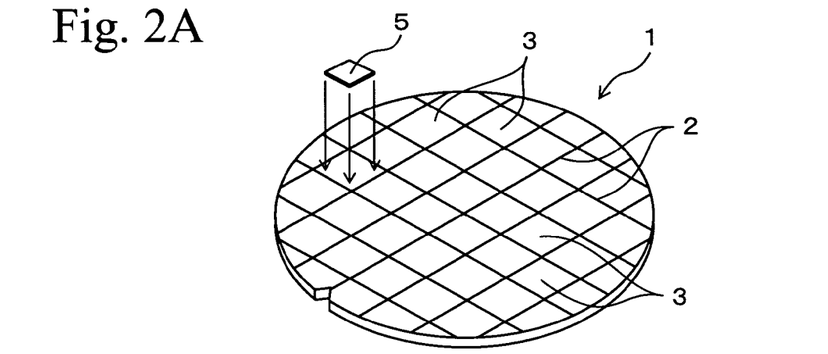
FIGS. 2A and 2B are perspective views showing conditions in which a semiconductor chip is bonded to a device surface of the semiconductor wafer.
Figure 2B:
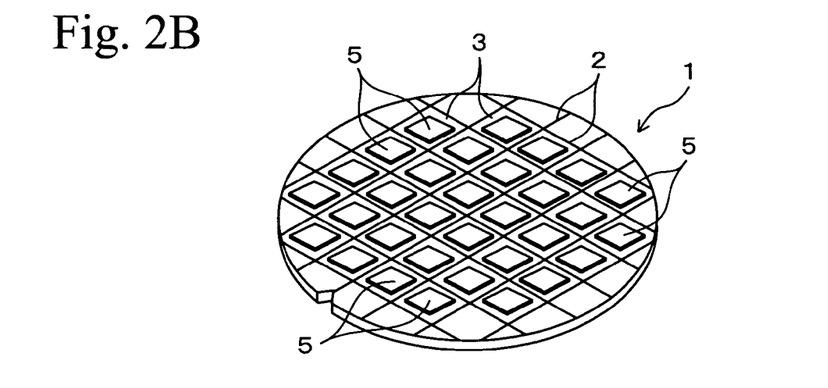

In the first embodiment, the semiconductor chips 3 of the wafer 1 are used as the primary chips. As shown in FIGS. 2A and 2B, semiconductor chips 5 (other semiconductor chips), which have the same thicknesses as those of the semiconductor chips 3, are stacked and bonded on the surfaces of the semiconductor chips 3 as the secondary chips. After that, the semiconductor chips 5 and the wafer 1 are thinned, and the wafer 1 is cut and divided along the streets 2. As a result, devices in which the semiconductor chips 5 are boned on the divided semiconductor chips 3 are obtained. In the following detailed description of this method, each "surface" of the wafer 1, the semiconductor chips 3, and the semiconductor chips 5 is a surface on which an electronic circuit is formed, and each "rear surface" is opposite to the "surface" and is a surface on which an electronic circuit is not formed.

1.1 Bonding Process

Figure 3A:
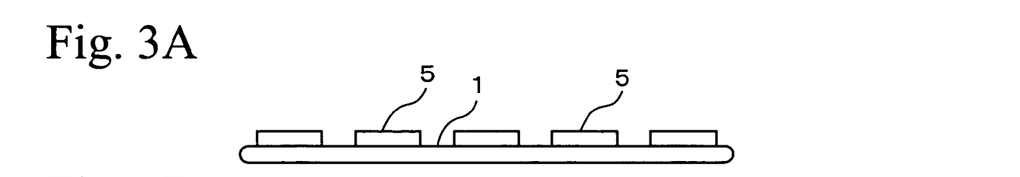
FIGS. 3A to 3G are cross sectional views showing processes of a production method of the first embodiment according to the present invention in order.

As shown in FIGS. 2A, 2B and 3A, surfaces (circuit surfaces) of the semiconductor chips 5 on which electronic circuits are formed are placed onto surfaces (circuit surfaces) of all the semiconductor chips 3 of the wafer 1, electrodes of the semiconductor chips 5 are connected to those of the semiconductor chips 3 in a predetermined combination thereof, and the semiconductor chips 5 are bonded to the semiconductor chips 3. In one method example of the bonding, the wafer 1 is mounted on a predetermined pedestal while the surface of the wafer 1 faces upward, and the semiconductor chip 5 which was obtained by dividing another wafer is moved on the semiconductor chip 3 by a chuck hand of a robot while the surface of the semiconductor chip 5 faces downward. After that, an electrode of the semiconductor chip 5 is positioned to an electrode of the semiconductor chip 3, and the semiconductor chip 5 is pressed on the semiconductor chip 3. In this condition, the electrodes of the semiconductor chips 3 and 5 are connected to each other by a connecting method (for example, by heating or ultrasonic welding). In one example of the positioning of the semiconductor chip 5, a typical alignment apparatus is used, the typical alignment apparatus used in semiconductor device production techniques which perform image processing of an image photographed by a CCD (Charge-Coupled Device) camera or the like. When a gap is formed between the wafer 1 and the semiconductor chips 5 bonded thereon, a resin for underfilling is sealed in the gap, if necessary.

1.2 Semiconductor Chip Grinding Process

Figure 3B:
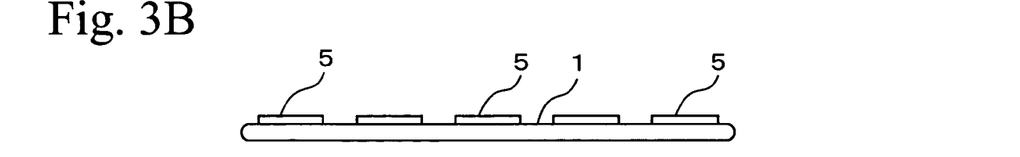

As shown in FIG. 3B, semiconductor chips 5 are thinned so as to have desired thicknesses (for example, about 25 to 100 μm). For the thinning of the semiconductor chips 5, the wafer 1 is held on a flat chuck table of a grinding apparatus (not shown in FIG. 3B) such that a rear surface of the wafer 1 faces the chuck table, and rear surfaces of the semiconductor chips 5 which are exposed upward in this condition are ground by the grinding apparatus. For example, an apparatus disclosed in Japanese Unexamined Patent Application Publication No. 2002-25961 can be used as the grinding apparatus. In the apparatus, a wafer is chucked and held on a vacuum chuck type chuck table, a grinding wheel disposed thereabove is moved downward, and the wafer is ground by grinding stones of the grinding wheel while the chuck table is rotated.

1.3 Resin Filling Process

Figure 3C:
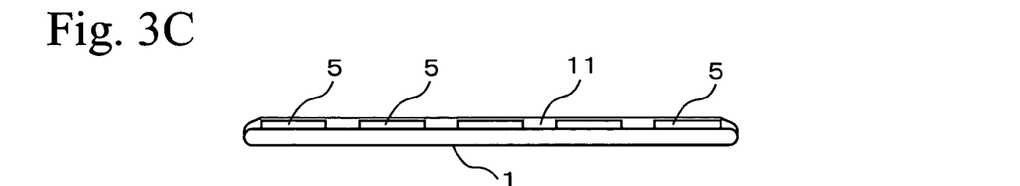

As shown in FIG. 3C, a resin 11 which is higher than the thinned semiconductor chips 5 is filled on the surface of the wafer 1 on which the semiconductor chips 5 are bonded, and the semiconductor chips 5 are resin-molded thereon. In this case, although the semiconductor chips 5 are covered with the resin 11, the resin 11 may be filled so as to have a surface which is at least as high as the rear surfaces (ground surfaces) of the semiconductor chips 5. In the first embodiment, the resin 11 is preferably filled such that the surface of the resin 11 is parallel to the surface of the wafer 1.

1.4 Wafer Grinding Process

Figure 3D:
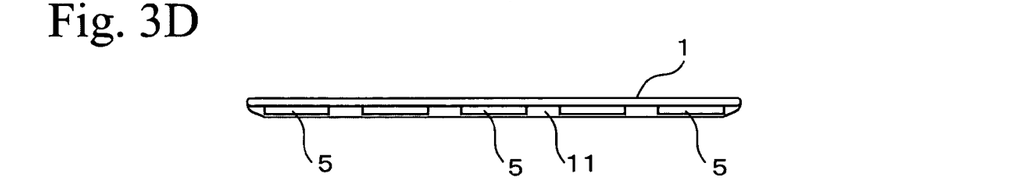

The wafer 1 is thinned so as to have a desired thickness (for example, about 25 to 100 μm). The thinning of the wafer 1 can use the same method as that used in the thinning of the semiconductor chips 5. As shown in FIG. 3D, the wafer 1 is held on a flat chuck table of a grinding apparatus such that the surface of the wafer 1 on which the resin 11 is filled faces the chuck table, and the rear surface of the wafer 1 which is exposed upward in this condition is ground by the grinding apparatus. Since the surface of the wafer 1 on which the resin 11 is filled is slightly roughened and the entirety thereof does not closely contact the chuck table, there may be cases in which the wafer 1 is warped and defects occur in the grinding of the rear surface of the wafer 1. In this case, a protective tape having a predetermined elasticity is preferably applied to the surface of the wafer 1 on which the resin 11 is filled, so that the protective tape closely contacts the chuck table, and the surface of the wafer 1 can reliably closely contact the holding surface of the chuck table without a gap formed therebetween. As a result, the grinding of the rear surface of the wafer 1 can be performed well.

1.5 Adhesive Film Applying Process

Figure 3E:
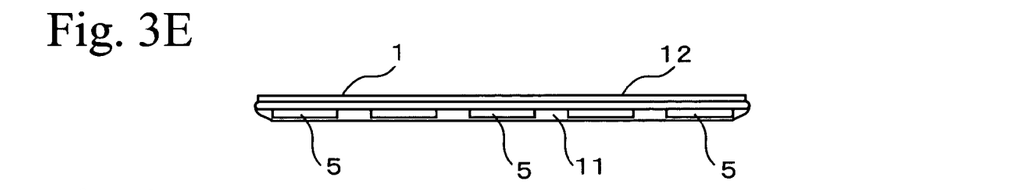

As shown in FIG. 3E, an adhesive film 12 is applied on the rear surface of the wafer 1 which is the ground surface. The adhesive film 12 is a resin film called a "DAF" (Die Attach Film) for chip stacking and applying. For example, the adhesive film 12 may have a film substrate and an adhesive material applied on both surfaces of the film substrate. For example, the adhesive material may include a mixture as a main component and an additive which is appropriately mixed therewith. For example, the mixture may include a thermoplastic polyimide resin, which has a glass transition temperature (Tg) of 90 degrees C. or less, and a thermosetting resin (for example, epoxide resin). For example, the additive may be an inorganic filler.

1.6 Wafer Supporting Process

Figure 3F:
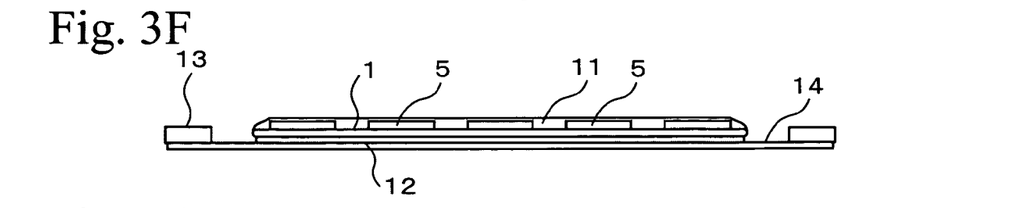

As shown in FIG. 3F, a dicing tape 14 having a ring-shaped dicing frame adhered thereon is applied to the ground rear surface of the wafer 1 as a supporting member. For example, the dicing tape 14 has a substrate and an adhesive which is applied on one surface of the substrate. For example, the substrate is composed of polyvinylchloride and has a thickness of about 100 μm. For example, the adhesive is composed of acrylic resin and has a thickness of about 5 μm. The dicing tape 14 has a circular shape having a diameter larger than that of the wafer 11. The dicing frame 13 is ring-shaped and has an inner diameter larger than the diameter of the wafer 1, and is applied on a peripheral portion of the dicing tape 14 on which the adhesive is applied. The dicing tape 14 is applied on the rear surface of the wafer 1 via the adhesive film 12 so as to be concentric with the wafer 1. The dicing tape 14 may be an integrated one which is integrally formed with the adhesive 12. When an integrated one is used, the applying of the adhesive film 12 is also performed by the applying of the dicing tape 14.

1.7 Dividing Process

Figure 3G:
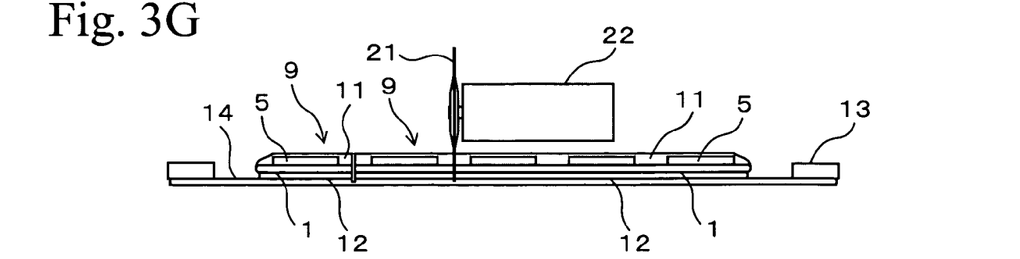

As shown in FIG. 3F, the entirety of the stacked structure, in which the thinned semiconductor chips 5 and the resin 11 are stacked on the surface of the thinned wafer 1 and the adhesive film 12 is applied on the rear surface of the thinned wafer 1, is supported by the dicing frame 13 and the dicing tape 14. After that, the stacked structure is cut along the streets of the wafer 1. As a result, as shown in FIG. 3G, the stacked structure is divided into plural devices 9 having chip-on-chip structures. Each chip-on-chip structure is constructed such that the semiconductor chip 5 is bonded on the divided semiconductor chip 3 and is molded by the resin 11 and the adhesive film 12 is applied on the rear surface of the semiconductor chip 3.

As shown in FIG. 3G, a cutting apparatus in which a disc-shaped cutting blade 21 is rotated by a spindle 22 is used for the cutting of the wafer 1. The cutting blade 21 cuts from the resin 11 to a thin layer of the dicing tape 14. A dicing apparatus disclosed in Japanese Unexamined Patent Application Publication No. 2001-85365 can be used as the cutting apparatus. In the above condition shown in FIG. 3G, the devices 9 are maintained to be applied on the dicing tape 14. After that, the devices 9 are separated from the dicing tape 14 one-by-one by an appropriate pick-up device and are packaged on a packaging substrate or the like.

In the production method of the first embodiment in the above process order, since not only the thicknesses of the semiconductor chips 5 but also the thickness of the wafer 1 which is finally intended to be divided into the semiconductor chips 3 in the dividing process is reduced, the obtained devices 9 are made much thinner overall. Since the rear surfaces of the semiconductor chips 5 are ground while the semiconductor chips 5 are bonded on the wafer 1 which is relatively thick, sufficient strength is maintained in the grinding of the rear surfaces of the semiconductor chips 5, so that damages (for example, cracking and breakage) are unlikely to be generated in the wafer 1 and the semiconductor chips 5. When the rear surface of the wafer 1 is ground by the grinding apparatus, the surface of the wafer 1 on which the resin is filled faces the chuck table and is held thereby, so that the wafer 1 can be stably held on the chuck table without being warped. Therefore, when the rear surface of the wafer 1 is ground, damages (for example, cracking and breakage) are unlikely to be generated in the wafer 1 and the semiconductor chips 5.

1.8 Modification Example of Supporting Member

Figure 4A:
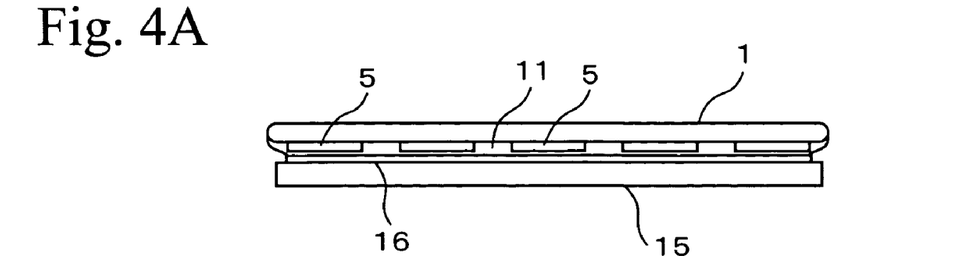
FIGS. 4A to 4D are cross sectional views showing one modification example of a supporting member of the first embodiment.
Figure 4B:
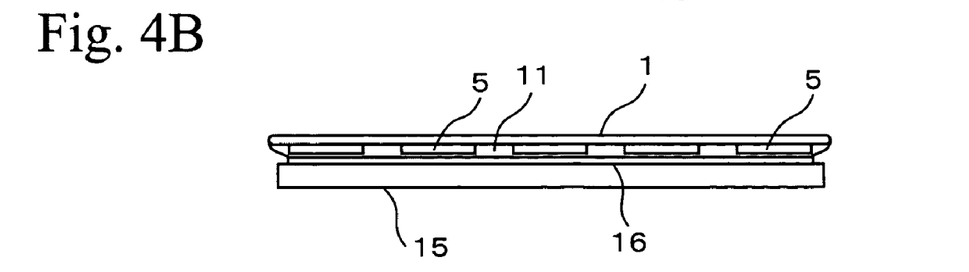
Figure 4C:
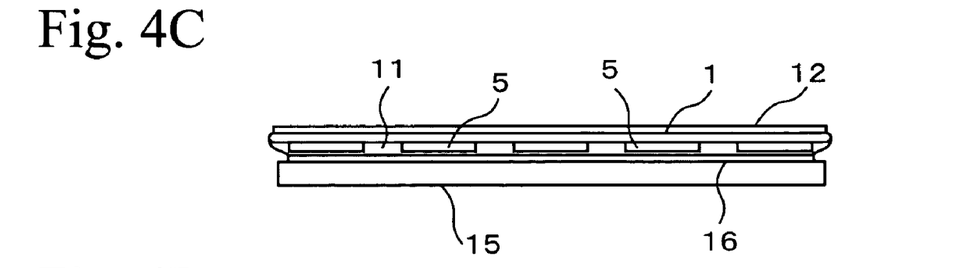

Instead of the dicing frame 13 and the dicing tape 14 used to support the wafer 1 in the dividing process in the first embodiment, as shown in FIG. 4A, a glass plate 15 having an appropriate thickness may be used. In this case, after the resin filling process shown in FIG. 3C, the glass plate 15 is applied via a double-sided tape 16 on the surface of the wafer 1 on which the resin 11 is filled (wafer supporting process). Next, as shown in FIG. 4B, the wafer 1 is thinned by grinding to have a desired thickness (wafer grinding process), and the adhesive film 12 is applied to the ground surface of the wafer 1 (adhesive film applying process). Instead of the double-sided tape 16 used for applying the glass plate 15 to the surface of the wafer 1 on which the resin 11 is filled, an adhesive may be used therefor.

Figure 4D:
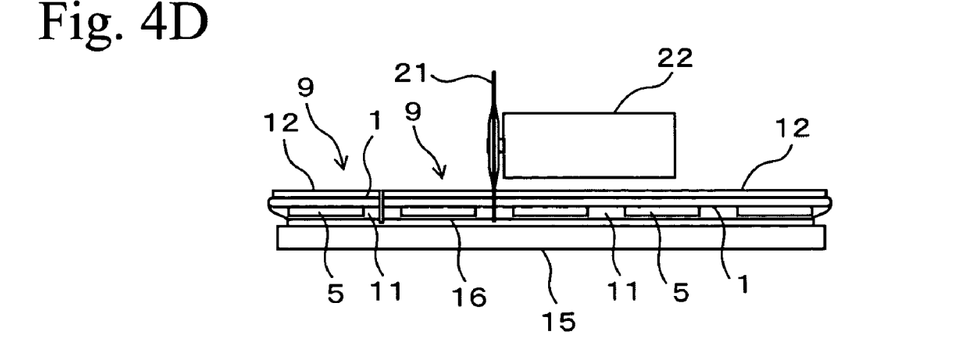

After that, as shown in FIG. 4D, the rear surface of the wafer 1 on which the adhesive film 12 is applied is cut by the cutting blade 21, the wafer 1 is divided along the streets 2, and the same devices 9 as those described above are obtained by picking them up from the double-sided tape 16 (dividing process). In order to detect the streets 2 from the rear surface of the wafer 1, an infrared camera for scanning the streets 2 can be used. Since the glass plate 15 which is highly rigid is used in the above manner, the supported condition of the wafer 1 by the glass plate 15 is securer when the wafer 1 is ground, so that the wafer 1 can be reliably ground. Instead of the glass plate 15, a plated member (for example, metal plate) which is rigid may be used as the supporting member.

1.9 Modification Example of Process Order

The first embodiment uses a method in which the semiconductor chips 5 are bonded to the wafer 1, the semiconductor chips 5 are thinned by the grinding, and the wafer 1 is finally divided into the devices 9. The order of the above processes is not limited to the above order, and can be freely modified. For example, the following order of the processes can be used.

Figure 5A:
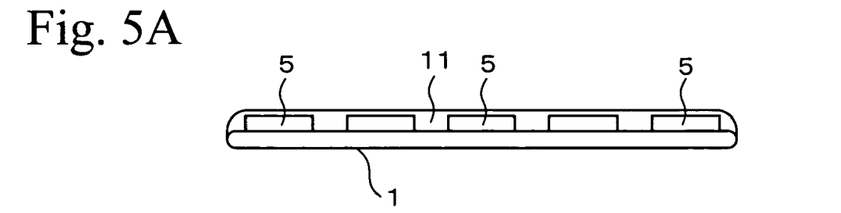
FIGS. 5A and 5B are cross sectional views showing one modification example of the process order of the first embodiment.
Figure 5B:
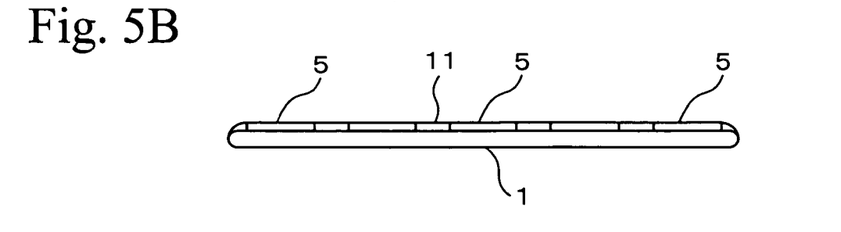

A. The semiconductor chip grinding process shown in FIG. 3B and the resin filling process shown in FIG. 3C may be performed in reverse order. That is, after the above bonding process for bonding the semiconductor chips 5 to the wafer 1, as shown in FIG. 5A, the resin 11 is filled on the surface of the wafer 1, and the semiconductor chips 5 are covered with the resin 11. Next, as shown in FIG. 5B, the semiconductor chips 5 are ground together with the resin 11 to have desired thicknesses. After that, the above wafer grinding process for grinding the wafer 1 is performed.

Figure 6A:
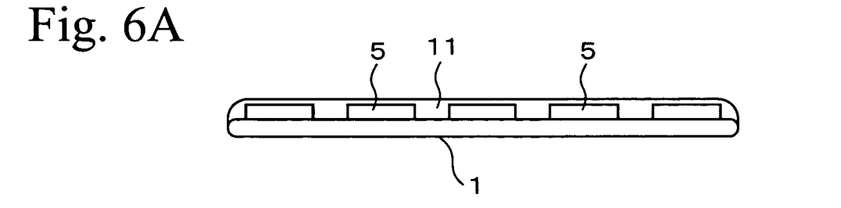
FIGS. 6A to 6D are cross sectional views showing another modification example of the process order of the first embodiment.
Figure 6B:
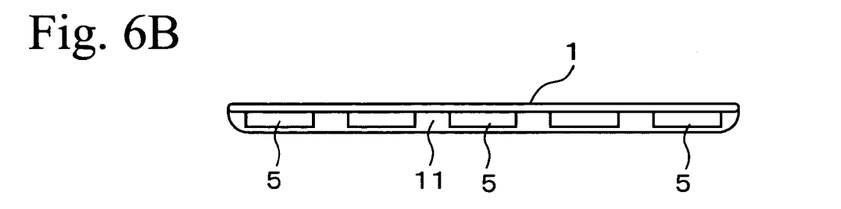
Figure 6C:
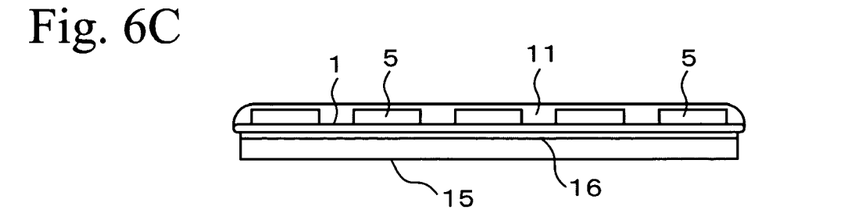
Figure 6D:
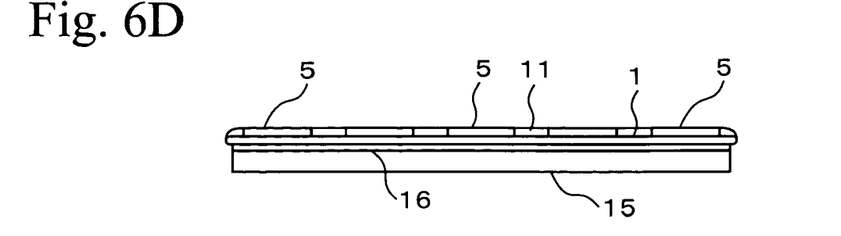

B. After the wafer 1 is thinned, the semiconductor chips 5 are thinned. That is, in this case, after the above bonding process for bonding the semiconductor chips 5 to the wafer 1, as shown in FIG. 6A, the resin 11 is filled on the surface of the wafer 1, so that the semiconductor chips 5 are covered with the resin 11 (resin filling process). Next, as shown in FIG. 6B, the wafer 1 is thinned by grinding (wafer grinding process). Next, as shown in FIG. 6C, the glass plate 15 is applied to the rear surface of the wafer 1 by the double-sided tape 16 (wafer supporting process). The wafer 1 is held via the glass plate 15 on the chuck table of the grinding apparatus and as shown in FIG. 6D, the semiconductor chips 5 are thinned by grinding (semiconductor chip grinding process). After that, the dividing process shown in FIG. 3G is performed.

2. Second Embodiment

Next, a production method of the second embodiment will be explained hereinafter.

2.1 Wafer Grinding Process

Figure 7A:
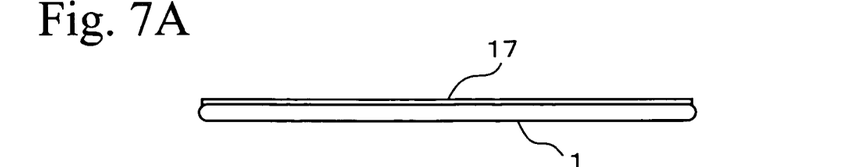
FIGS. 7A to 7G are cross sectional views showing processes of a production method of the second embodiment according to the present invention in order.
Figure 7B:
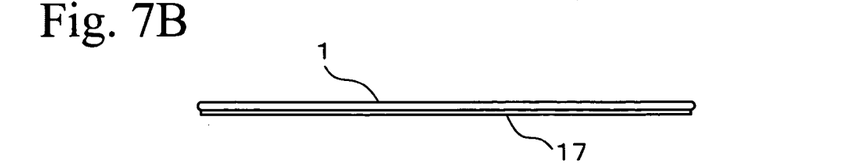

As shown in FIG. 7A, a protective tape 17 for protecting the electronic circuits is applied to the surface (the upper surface in FIG. 7A) of the wafer 1. Next, as shown in FIG. 7B, the protective tape 17 is positioned to face downward, the wafer 1 is held on the chuck table of the grinding apparatus, and the rear surface of the wafer 1 is ground, so that the wafer 1 is thinned to have a desired thickness (for example, 25 to 100 μm). Instead of the protective tape 17, the glass plate 15 may be used.

2.2 Adhesive Film Applying Process

Figure 7C:
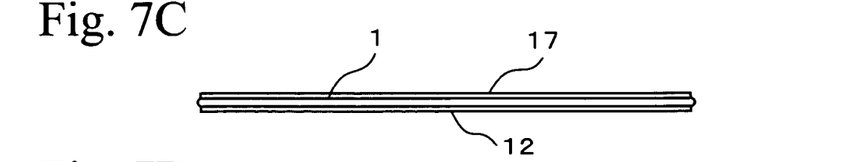

As shown in FIG. 7C, the adhesive film 12 is applied to the rear surface of the wafer 1 which is the ground surface.

2.3 Bonding Process

Figure 7D:
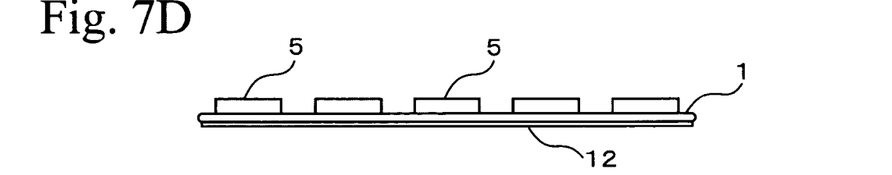

The protective tape 17 is peeled from the surface of the wafer 1. Then, as shown in FIG. 7D, in the same manner as in the first embodiment, the semiconductor chips 5 are respectively bonded to semiconductor chips 3 on the surface of the wafer 1. The bonded semiconductor chips 5 have thicknesses of at least 400 μm or more (for example, about 600 to 800 μm).

2.4 Wafer Supporting Process

Figure 7E:
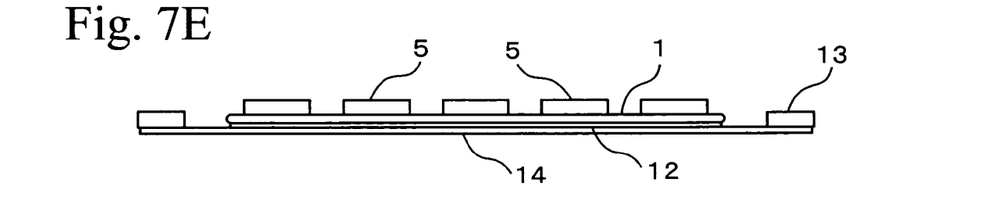

As shown in FIG. 7E, the dicing tape 14, which is the same as that in the first embodiment and has the ring-shaped dicing frame 13 applied thereon, is applied to the ground rear surface of the wafer 1 via the adhesive film 12.

2.5 Semiconductor Chip Grinding Process

The wafer 1 supported by the dicing frame 13 and the dicing tape 14 is held on the chuck table of the grinding apparatus such that the rear surface of the wafer 1 faces the chuck table. In this condition, the rear surfaces of the semiconductor chips 5 are respectively ground by the grinding apparatus, and the semiconductor chips 5 are thinned to have desired thicknesses (for example, about 25 to 100 μm).

2.6 Dividing Process

Figure 7F:
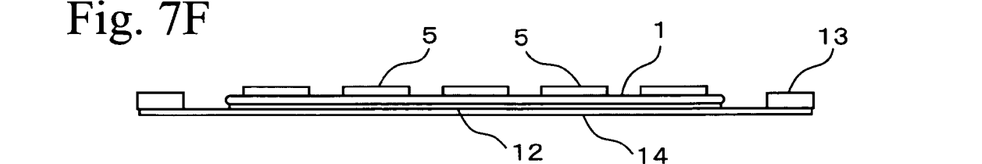
Figure 7G:
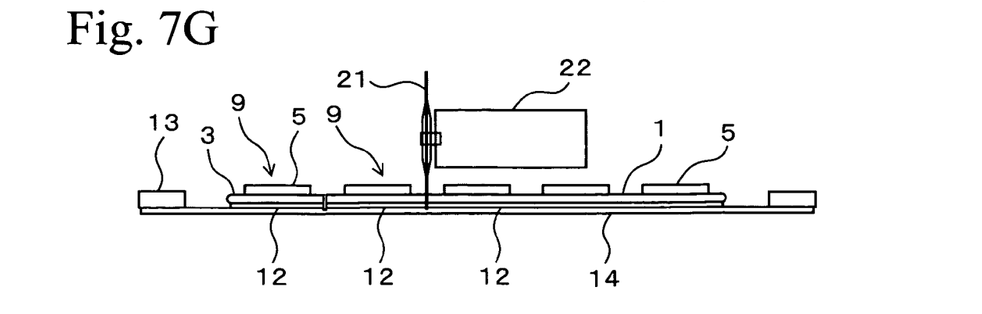

The entirety of the stacked structure, which has the thinned wafer 1, the thinned semiconductor chips 5 stacked on the surface of the thinned wafer 1 and the adhesive film 12 applied on the rear surface of the wafer 1, is supported by the dicing frame 13 and the dicing tape 14 as shown in FIG. 7F. The stacked structure is cut along the streets 2 by using the cutting blade 21 shown in FIG. 7G. As a result, the stacked structure is divided into the plural devices 9 having chip-on-chip structures in which the semiconductor chips 5 are bonded on the divided semiconductor chips 3 and the adhesive film 12 is applied on the rear surfaces of the semiconductor chips 3. After that, the devices 9 are separated from the dicing tape 14 one-by-one by an appropriate pick-up device and are packaged on a packaging substrate or the like.

In the above second embodiment, the wafer 1 is first thinned, the semiconductor chips 5 bonded on the wafer 1 are thinned, and the wafer 1 is finally divided, so that the devices 9 are obtained. In the same manner as in the first embodiment, both the wafer 1 and the semiconductor chips 5 are ground, so that the obtained devices 9 are made much thinner overall. Since the surface of the wafer 1 faces the chuck table and is held thereby in the first wafer grinding process, the wafer 1 can be ground while the wafer 1 can be stably held by the chuck table without bending the wafer 1, damages are unlikely to be generated in the wafer 1.

2.7 Modification Example of Process Order

Figure 8A:
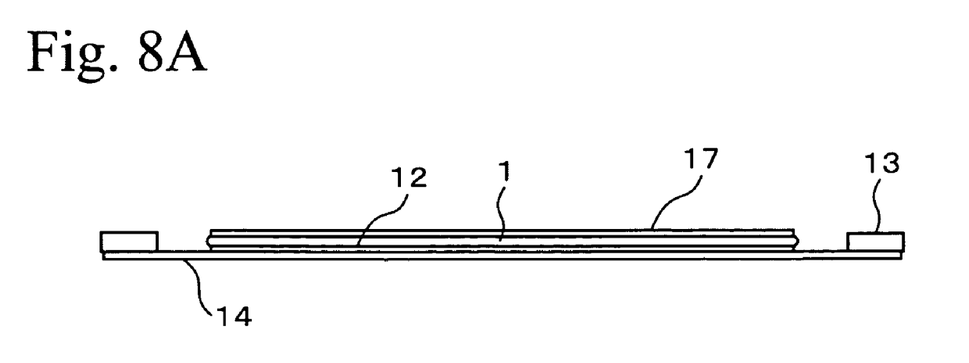
FIGS. 8A and 8B are cross sectional views showing one modification example of the process order of the second embodiment.
Figure 8B:
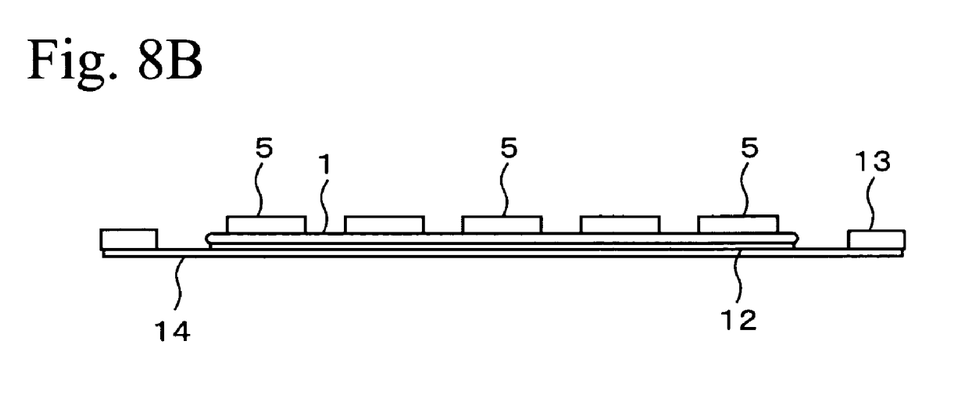

The second embodiment uses a method in which the wafer 1 is thinned, the semiconductor chips 5 are bonded to the wafer 1, the semiconductor chips 5 are thinned, and the wafer 1 is finally divided into the devices 9. The order of the above processes is not limited to the above order, and it can be freely modified. For example, after the adhesive film applying process shown in FIG. 7C, as shown in FIG. 8A, the dicing frame 13 and the dicing tape 14 are provided to the rear surface of the wafer 1 via the adhesive film 12. Next, after the protective tape 17 is peeled as shown in FIG. 8B, the semiconductor chips 5 are bonded to the surfaces of the semiconductor chips 3 (bonding process). Instead of using the dicing frame 13 and the dicing tape 14, as shown in FIG. 6C, the wafer 1 may be supported by using the glass plate 15. After that, the processes from the semiconductor chip grinding process shown in FIG. 7E of the first embodiment are performed.

It is therefore intended that the foregoing detailed description be regarded as illustrative rather than limiting, and that it be understood that it is the following claims, including all equivalents, that are intended to define the spirit and scope of this invention.

What is claimed is:

1. A production method for devices, comprising:
   a preparing process for preparing a wafer having plural semiconductor chips which have electronic circuits formed on circuit surfaces of the semiconductor chips and which are partitioned by predetermined division lines on a surface of the wafer, and for preparing other divided plural semiconductor chips having electronic circuits formed on circuit surfaces of the other semiconductor chips;
   a bonding process for placing the circuit surfaces of the other semiconductor chips onto the circuit surfaces of the semiconductor chips of the wafer and bonding the other semiconductor chips to the semiconductor chips of the wafer;
   a semiconductor chip grinding process for grinding rear surfaces of the other semiconductor chips by a grinding apparatus while the wafer having the other semiconductor chips bonded thereon is held such that the rear surface of the wafer faces a chuck table of the grinding apparatus;
   a resin filling process for filling a resin on the surface of the wafer having the other semiconductor chips bonded thereon so that a surface of the resin at least corresponds with the rear surfaces of the other semiconductor chips;
   a wafer grinding process for grinding the rear surface of the wafer having the resin filled on the surface by a grinding apparatus while the wafer is held such that the surface of the wafer on which the resin is filled faces a chuck table of the grinding apparatus;
   a wafer supporting process for supporting one of the surface and the rear surface of the wafer by a supporting member; and
   a dividing process for dividing the wafer along the predetermined division lines while the wafer, which is processed by the bonding process, the semiconductor chip grinding process, the resin filling process, the wafer grinding process, and the wafer supporting process, is supported by the support member, thereby obtaining devices having the semiconductor chips and the other semiconductor chips bonded on the semiconductor chips.

2. A production method for devices according to claim 1, wherein in the wafer grinding process, a protective tape is applied to the surface of the wafer on which the resin is filled, and the wafer is held on the chuck table via the protective tape.

3. A production method for devices according to claim 1, wherein
   the supporting member comprises:
   a dicing tape applied to the rear surface of the wafer; and
   a dicing frame provided on the dicing tape.

4. A production method for devices according to claim 1, wherein
   the supporting member is a plate-shaped member composed of glass or metal which is rigid.

5. A production method for devices according to claim 1, wherein
   when the supporting member is applied to the rear surface of the wafer in the wafer supporting process, an adhesive film for bonding is applied to the rear surface of the wafer before the wafer supporting process, and
   when the supporting member is applied to the surface of the wafer in the wafer supporting process, an adhesive film for bonding is applied to the rear surface of the wafer at least before the dividing process.

* * * * *

UNITED STATES PATENT AND TRADEMARK OFFICE
CERTIFICATE OF CORRECTION

PATENT NO. : 7,648,889 B2  Page 1 of 1
APPLICATION NO. : 11/586234
DATED : January 19, 2010
INVENTOR(S) : Kazuma Sekiya It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 634 days.

Signed and Sealed this

Twenty-third Day of November, 2010

David J. Kappos
*Director of the United States Patent and Trademark Office*